United States Patent [19]
McIntyre et al.

[11] Patent Number: 6,137,112
[45] Date of Patent: Oct. 24, 2000

[54] TIME OF FLIGHT ENERGY MEASUREMENT APPARATUS FOR AN ION BEAM IMPLANTER

[75] Inventors: Edward K. McIntyre, Franklin; Kevin W. Wenzel, Belmont; David R. Swenson, Georgetown; Ernst F. Scherer, Hamilton; William F. Divergilio, Beverly; Kourosh Saadatmand, Merrimac, all of Mass.

[73] Assignee: Eaton Corporation, Cleveland, Ohio

[21] Appl. No.: 09/150,177

[22] Filed: Sep. 10, 1998

[51] Int. Cl.$^7$ .................................................... H01J 37/244
[52] U.S. Cl. ...................................... 250/492.21; 250/287
[58] Field of Search ............................... 250/492.21, 287, 250/283

[56] References Cited

U.S. PATENT DOCUMENTS

| | | |
|---|---|---|
| 4,667,111 | 5/1987 | Glavish et al. . |
| 5,396,065 | 3/1995 | Myerholtz et al. . |
| 5,543,624 | 8/1996 | Bergmann . |
| 5,591,969 | 1/1997 | Park et al. ............................. 250/287 |
| 5,614,711 | 3/1997 | Li et al. . |

FOREIGN PATENT DOCUMENTS 57-40846  3/1982  Japan .

*Primary Examiner*—Kiet T. Nguyen
*Attorney, Agent, or Firm*—Watts, Hoffmann, Fisher & Heinke, Co. L.P.A.

[57] ABSTRACT

An ion implanter including a time of flight energy measurement apparatus for measuring and controlling the energy of an ion beam includes an ion source for generating the ion beam, an ion acceleration assembly for accelerating the beam resulting in the beam comprising a series of ion pulses having a predetermined frequency and beam forming and directing structure for directing the ion beam at workpieces supported in an implantation chamber of the implanter. The time of flight energy measurement apparatus includes spaced apart first and second sensors, timing circuitry and conversion circuitry. The time of flight energy measurement apparatus measures an average kinetic energy of an ion included in a selected ion pulse of the ion beam. The first sensor and a second sensor are disposed adjacent the ion beam and spaced a predetermined distance apart, the second sensor being downstream of the first sensor. The first sensor generates a signal when an ion pulse of the ion beam passes the first sensor and the second sensor generates a signal when an ion pulse of the ion beam passes the second sensor. The timing circuitry of the energy measurement apparatus is electrically coupled to the first and second sensors and determines an elapsed time, t, for the selected ion pulse to traverse the predetermined distance between the first and second sensors. The timing circuitry calculates an average number of ion pulses, N, in the ion beam between the first and second sensors based on the approximation of the ion beam energy and calculates an offset time, t(offset), for the selected ion pulse using the formula, t(offset)=N×T. The timing circuitry than determines the elapsed time, t. The conversion circuitry converts the elapsed time, t, for the selected ion pulse into a measure of the energy of the ion beam.

24 Claims, 7 Drawing Sheets

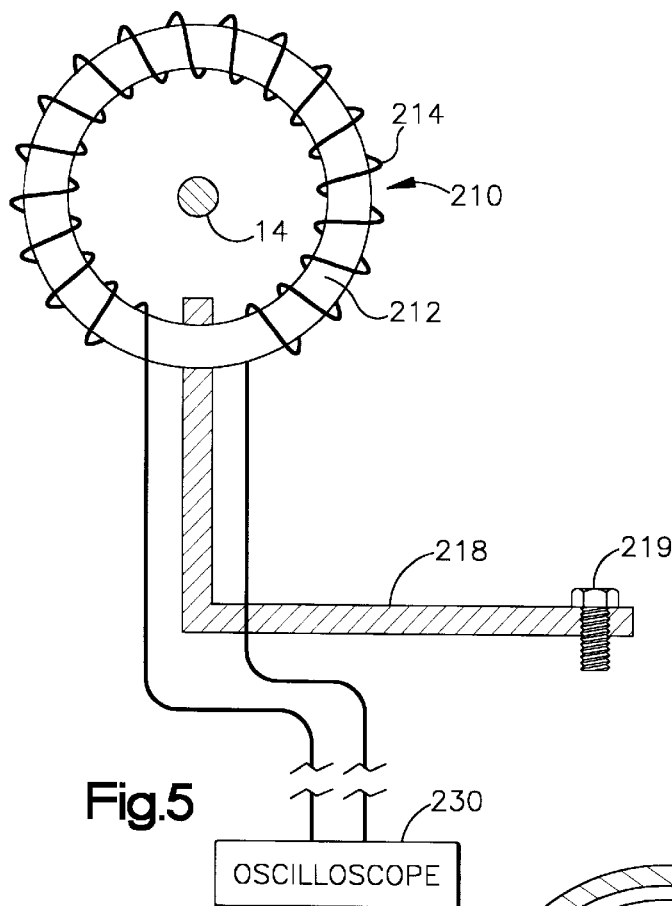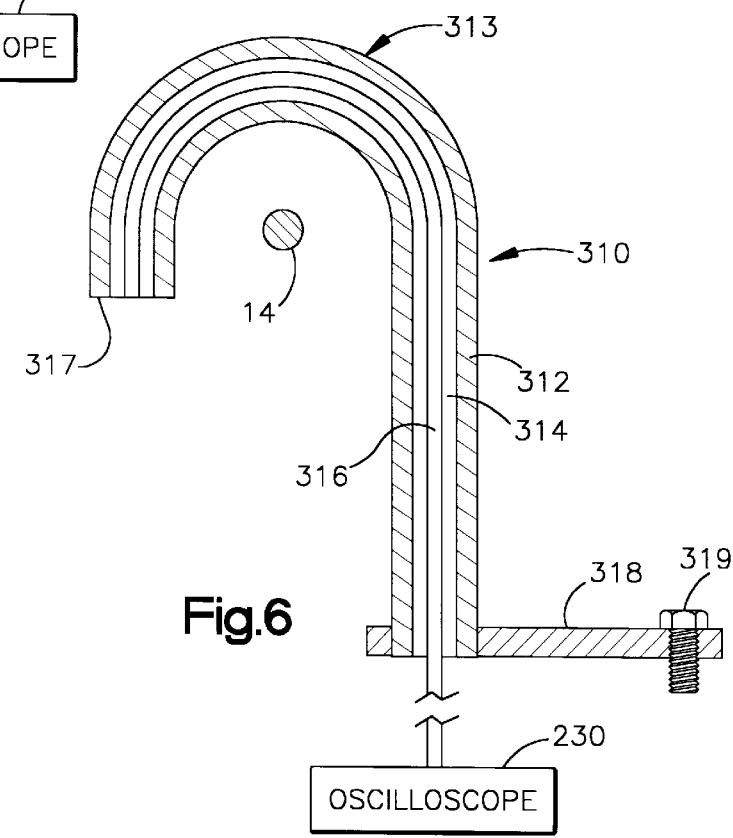

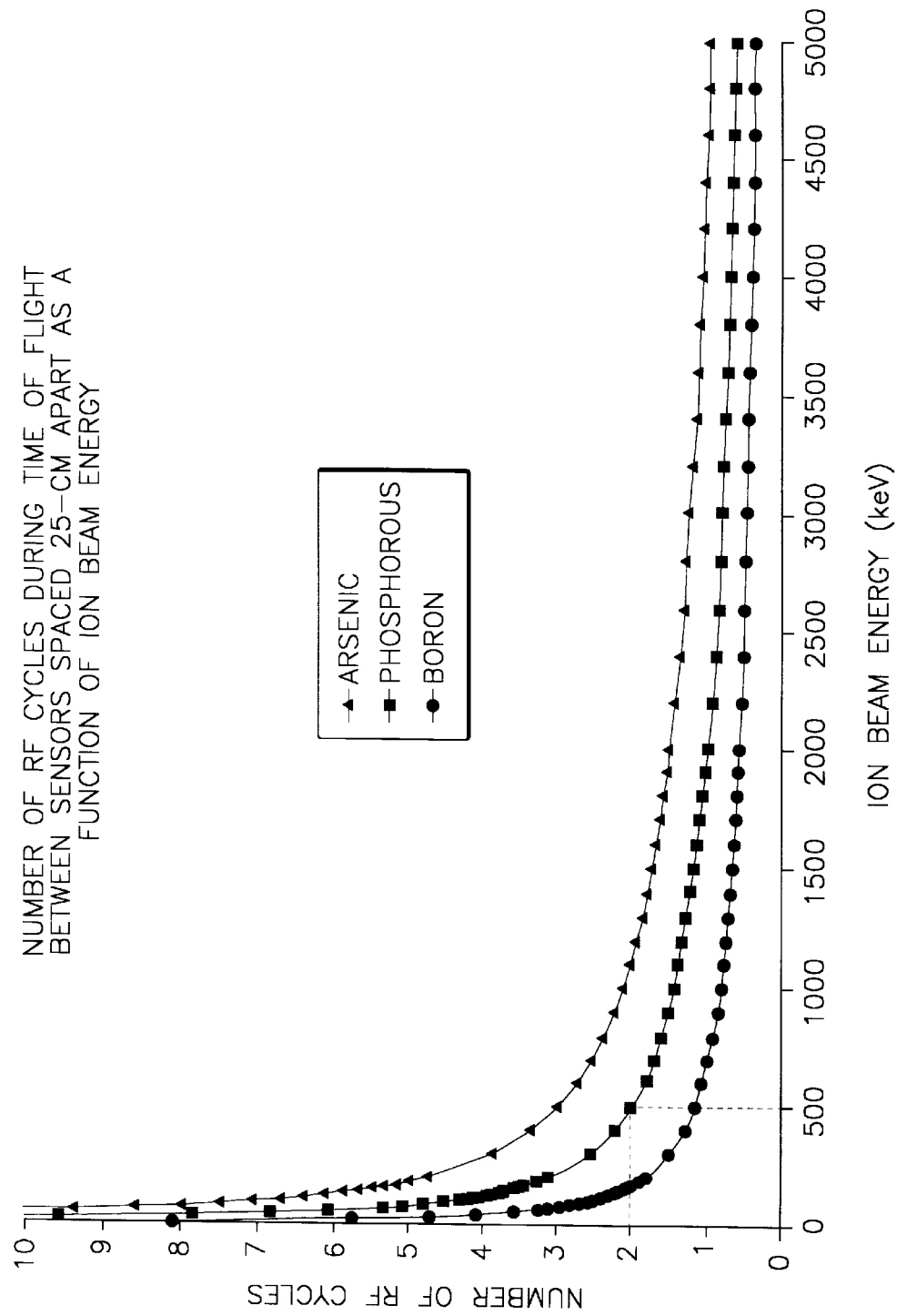

TIME OF FLIGHT ENERGY MEASUREMENT APPARATUS FOR AN ION BEAM IMPLANTER

FIELD OF THE INVENTION

The present invention relates to an ion beam implanter and, more particularly, to an apparatus using a time of flight technique for measuring the average kinetic energy of an ion in an ion beam used for ion doping of semiconductor workpieces in an ion beam implanter.

BACKGROUND OF THE INVENTION

Ion beam implanters are widely used in the process of doping of semiconductor wafers with a desired species of ions. An ion beam implanter generates an ion beam comprises of the desired species of positively charged ions. The ion beam impinges upon an exposed surface of a semiconductor wafer workpiece thereby "doping" or implanting the workpiece surface with desired ions. Some ion beam implanters utilize serial implantation wherein a single semiconductor wafer workpiece is positioned on a support in an implantation chamber. The support is oriented such that the workpiece is in the ion beam beam line and the ion beam is repetitively scanned over the workpiece to implant a desired dosage of ions. When implantation is complete, the workpiece is removed from the support and another workpiece is positioned on the support.

Another type of ion beam implanter uses a rotating, translating disk-shaped support on which workpieces are mounted. A plurality of semiconductor workpieces are mounted on the disk-shaped support. The support is supported in an implantation chamber of an end or implantation station of the ion beam implanter. The rotation and translation of the support allows each of the plurality of workpieces to be exposed to the ion beam during a production run.

Accuracy in both: a) the quantity of ions implanted in a semiconductor wafer workpiece during the implantation process; and b) the implantation depth of ion implantation in the workpiece surface are of critical importance in producing an acceptable end product. The allowable tolerances on implantation depth and total ion implantation quantity or dose in the manufacturing of many semiconductor devices are now at the 1% level in many applications.

Ion implantation depth of workpieces in an ion beam implanter is directly dependent on the energy of the ion beam. Therefore, accuracy in achieving desired implantation depth requires accurate control, measurement and monitoring of the energy of the ion beam.

Prior art high energy ion implanters control ion beam energy using a final energy magnet (FEM). The control of ion beam energy using an FEM assumes the energy of the ion beam can be selected by choosing the strength of the magnetic field needed to "bend" or cause desired species of ions comprising the ion beam to move in a predetermined accurate path toward workpieces supported on a support within the implantation chamber. The ion beam is directed though the FEM. The magnetic field causes the ions comprising the ion beam to travel in an accurate path. The strength of the magnetic field is adjusted such that desired species of ions having a particular momentum follow a curvilinear path to the implantation chamber where the workpieces are disposed.

Unfortunately, the accuracy of the FEM method of computing ion beam energy has a serious drawback in that the magnitude of bending of the ion beam is a function of the entry angle of the ions into the magnetic field of the FEM. Even a slight difference of entry angles (2–3 degrees) of the ions when entering the FEM magnetic field has a significant impact on the magnitude of the ion beam bending. Numerical simulations and empirical tests have shown that the FEM energy readback can be incorrect by up to +/−10% of the desired energy of the ion beam under certain conditions.

What is needed is a more accurate ion beam energy measurement apparatus for an ion implanter. What is also needed is such an energy measurement apparatus that is relatively inexpensive, durable and that provides for rapid, real time updating of beam energy. What is further needed is an energy measurement apparatus that can be retrofit for use on current generation ion beam implanters without requiring extensive modification of an implanter.

SUMMARY OF THE INVENTION

In accordance with the present invention, an ion beam implanter for directing an ion beam against a plurality of semiconductor wafer workpieces is disclosed. The ion implanter includes an implantation station defining an implantation chamber. The plurality of workpieces are supported on a disk-shaped rotatable and translatable support disposed within the implantation chamber. The ion implanter further includes an ion source generating the ion beam and beam forming and directing apparatus defining an interior region through which the ion beam passes from the ion source to the implantation station. A pump system is provided for pressurizing and depressurizing the interior region. A radio frequency (rf) ion accelerator is positioned between the ion source and the implantation station for accelerating the ions with the ion beam to achieve desired high beam energies.

The implanter includes a novel ion beam energy measurements apparatus utilizing a time of flight technique to determine the average kinetic energy of an ion in an ion pulse of the ion beam. The energy measurement apparatus takes advantage of the fact that in high energy implantation applications using an rf ion accelerator, the ion beam is a series of beam packets or pulses. The time of flight technique is advantageously applied by the energy measurement apparatus to accurately determine the average ion energy in the ion beam. Timing circuitry of the energy measurement apparatus determines the time, t, for a pulse (containing a plurality of ions) to traverse a predetermined distance between two sensors. Importantly, the energy measurement apparatus utilizes a "rough" estimate of the energy of an ion in the ion beam generated by the FEM to insure that the pulse elapsed time determined by the timing circuitry is accurate. The mean or average velocity of an ion bunch or pulse is determined by the conversion circuitry using the formula, v(pulse)=d/t, where d=distance between the first and second sensors and t=elapsed time for the pulse to travel from the first sensor to the second sensor. Once the velocity of the pulse is determined, the energy of the ion, E(ion), is determined by $E(ion)=\frac{1}{2}m(ion)v^2$, where v=velocity of the pulse and m(ion)=mass of the ion in the pulse. The mass of an ion of the desired implantation species is accurately known.

The energy measurement apparatus includes a first sensor and a second sensor disposed adjacent the ion beam and spaced a predetermined distance apart, the second sensor being downstream of the first sensor. The first sensor generates a signal as a pulse of the ion beam passes the first sensor and the second sensor generates a signal as a pulse of the ion beam passes the second sensor.

In a first embodiment of the energy measurement apparatus, the apparatus takes advantage of the fact that the rf ion accelerator generates a series of beam pulses at a constant frequency, thus the period between adjacent pulses in the beam line is known. The timing circuitry of the energy measurement apparatus determines the elapsed time, $\Delta t$, between a first pulse passing the first sensor and a second pulse passing the second sensor. Knowing the period between successive pulses and based on an approximation of pulse velocity from the FEM, the time, t, of the first pulse traversing the distance between the first and the second sensors is calculated by the timing circuitry as:

$$t=[N \times T]+\Delta t$$

where:

N=the number of pulses between the first and second sensors

T=the time period between pulses.

As explained above, the time period, T, between pulses is known because the frequency of pulses is known from the rf ion accelerator. The number of pulses, N, between the first and second sensors is known based on the FEM energy approximation. The timing circuitry accurately determines $\Delta t$ using a cross correlation calculation of the digitized waveforms received from the first and second sensors. Once the time, t, of the pulse traversing the distance, d, between the first and the second sensors is accurately known, conversion circuitry calculates the velocity of an ion pulse as follows: v(pulse)=d/t, where d is the distance between the first and second sensors.

In a second embodiment, the energy measurement apparatus includes timing circuitry which utilizes the ion energy approximation of the FEM in a slightly different way. In this embodiment, the energy approximation is utilized to insure that the time of flight of a single pulse is tracked between the first and second sensors. The timing circuitry includes a first timing differentiator, a second timing differentiator and a delay circuit. The first timing differentiator is electrically coupled to the first sensor and generates a first signal when a signal is received from the first sensor. The second timing differentiator is electrically coupled to the second sensor and generates a second signal when a signal is received from the second sensor.

The delay circuit is electrically coupled to the first and second timing differentiators and receives the first and second signals generated by the differentiators. The delay circuit also receives data representative of an approximate measurement of the energy of the ion beam. This approximate energy measurement data is received from the FEM upstream from the first sensor. The delay circuit converts the approximate energy measurement data and generates a delay time for an ion beam pulse using the mass of the accelerated ion species. For a selected ion pulse, the timing circuitry, utilizing the first and second signals corresponding to the selected ion pulse and the delay time, calculates an elapsed time for the selected pulse to traverse the predetermined distance between the first and second sensors.

The energy measurement apparatus further includes conversion circuitry for converting the elapsed time for the selected ion pulse into a measure of the energy of the ion beam.

The energy measurement apparatus of the present invention is useful as an ion beam dosimetry monitor by providing an alternate means to measure the current, independent of the Faraday cage positioned behind the implantation chamber support. The interior region defined by beam forming and directing structure upstream of the implantation chamber is in a constant depressurized condition during implantation. The signal amplitude from the energy measurement apparatus sensors depends on the ion beam current level. Because the energy measurement apparatus is disposed in a portion of the ion implanter interior region that has a relatively constant pressure, the ion beam current can be accurately measured independent of any charge neutralizing collisions that may occur in regions of the beam line, downstream of the energy measurement apparatus sensors, where the implantation chamber pressure can be higher. In other parts of the ion implanter, such as the implantation station, the gas pressure can vary, which can electrically neutralize the ion beam causing errors in the Faraday cage current measurement.

Current art ion implanters provide an opening in the support which exposes the Faraday cage to the ion beam once per revolution of the support. The Faraday cage reads ion beam current only once per revolution of the support. The energy measurement apparatus of the present invention advantageously provides for a faster scan of the ion beam energy and current than is possible using a Faraday cage positioned behind the rotating support.

In one operating embodiment of the energy measurement apparatus, the first and second sensors comprise first and second inductive sensors. The first and second inductive sensors are spaced a predetermined distance apart adjacent the beam line. The first inductive sensor generates a signal when a pulse passes the first sensor. The second inductive sensor generates a signal when the pulse passes the second sensor.

In a second operating embodiment of the energy measurement apparatus of the present invention, the first and second sensors comprise capacitive rather than inductive sensors. As with the inductive sensors, the capacitive sensors are placed a predetermined distance apparatus along the ion beam beam line.

These and other objects, features and advantages of the invention will become better understood from the detailed description of the preferred embodiments of the invention which are described in conjunction with the accompanying drawings.

BRIEF DESCRIPTION OF THE DRAWINGS

FIG. 3A is a schematic representation of ion pulses comprising a portion of an ion beam generated by the ion beam implanter of FIG. 1.

FIG. 5 is a schematic representation of an inductive sensor of the energy measurement apparatus of the present invention;

FIG. 6 is a schematic representation of a capacitive sensor of the energy measurement apparatus of the present invention;

FIG. 8 is a graph illustrating the relation between ion beam energy and the number of radio frequency cycles that must be counted before stopping an elapsed time of an ion pulse wherein the first and second sensors spaced apart 25 centimeters.

DETAILED DESCRIPTION

Structure of Ion Beam Implanter 10

Figure 1:
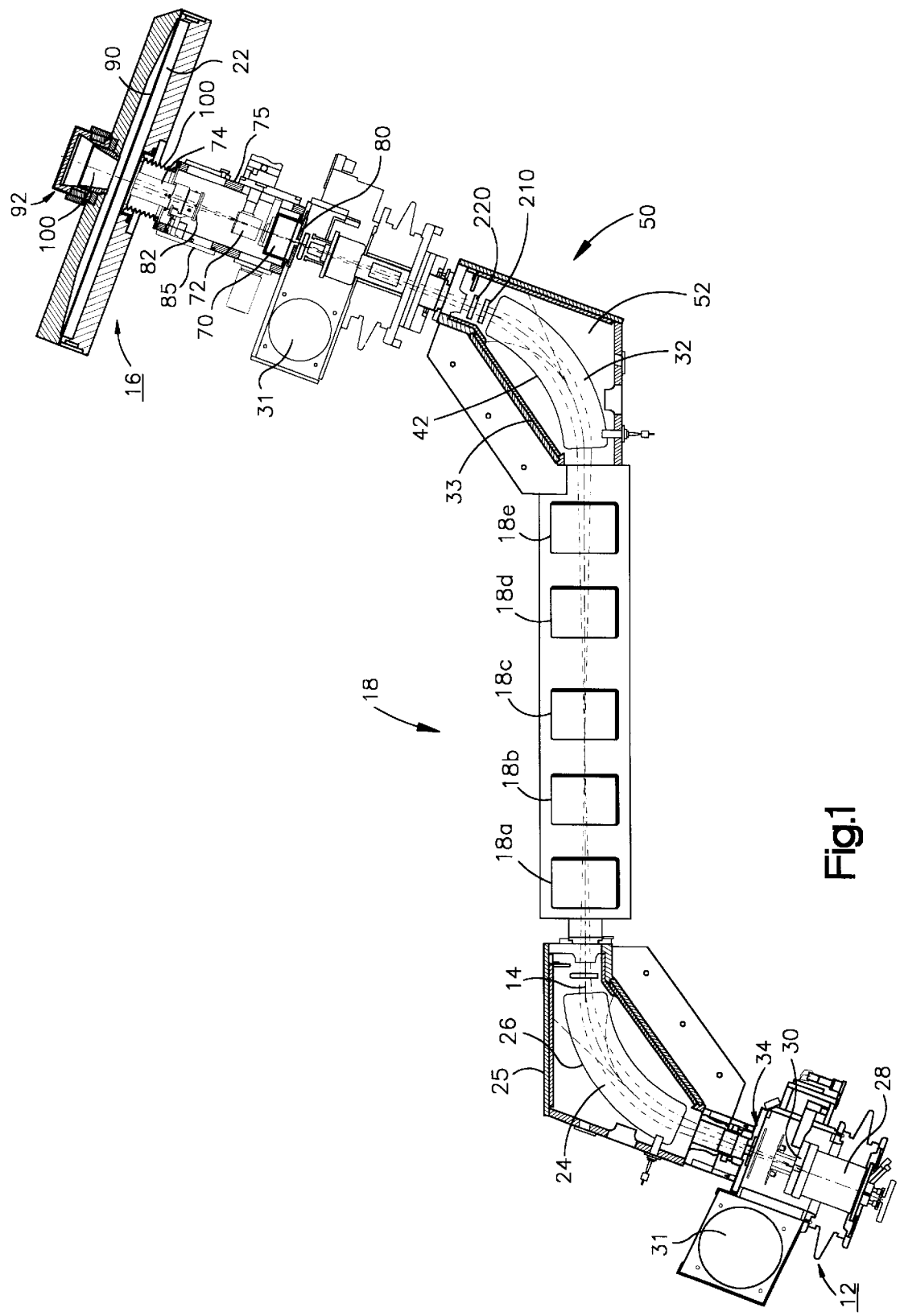
FIG. 1 is a schematic top plan view of an ion beam implanter of the present invention.

A high-energy ion beam implanter is shown generally at 10 in FIG. 1. The implanter 10 produces an ion beam 14 having a beam energy in the range of 10–5000 kiloelectron volts (keV). The implanter 10 includes an ion source 12 for providing ions that form the ion beam 14 which traverses a beam path to an implantation or end station 16. The implanter 10 utilizes a radio frequency (rf) ion accelerator 18 to accelerate ions in the ion beam 14 to suitably high velocities to achieve the desired ion beam energy. A suitable rf ion accelerator 18 for use in a high energy implanter is disclosed in U.S. Pat. No. 4,667,111 to Glavish et al. and is assigned to the assignee of the present invention. U.S. Pat. No. 4,667,111 is incorporated herein in its entirety by reference.

In a high energy implanter such as the implanter 10, the ion beam 14 can be analyzed as a train or series of discreet pulses, each pulse comprising a large number of ions, on the order of $10^{13}$ ions. A number of ion pulses of the ion beam 14 are schematically shown as P0, P1, P2, P3, . . . , P(n−1), Pn, P(n+1) in FIGS. 3, 3A and 4. Control electronics (shown schematically at 20 in FIG. 2) are provided for monitoring and controlling the ion dosage received by a plurality of semiconductor wafer workpieces 21 within an implantation region or chamber 22 of the implantation station 16. A user console 67 permits operator input to the control electronics 20.

The ion source housing 12 generates the ion beam 14 which impacts the wafer workpieces 21 disposed on a rotating and translating disk 90 in the implantation chamber 22. The ions in the ion beam 14 tend to diverge as the beam 14 traverses a distance between the ion source 12 and the implantation station 16. The ion source 12 includes a plasma chamber 29 defining an interior region into which source materials are injected. The source materials may include an ionizable gas or vaporized source material. Source material in solid form is deposited into a vaporizer which is then injected into the plasma chamber 28. If an n type extrinsic wafer material is desired, boron, gallium or indium will be used. Gallium and indium are solid source materials, while boron is injected into the plasma chamber 28 as a gas, typically boron trifluoride or diborane, because boron's vapor pressure is too low to result in a usable pressure by simply heating solid boron.

Figure 2:
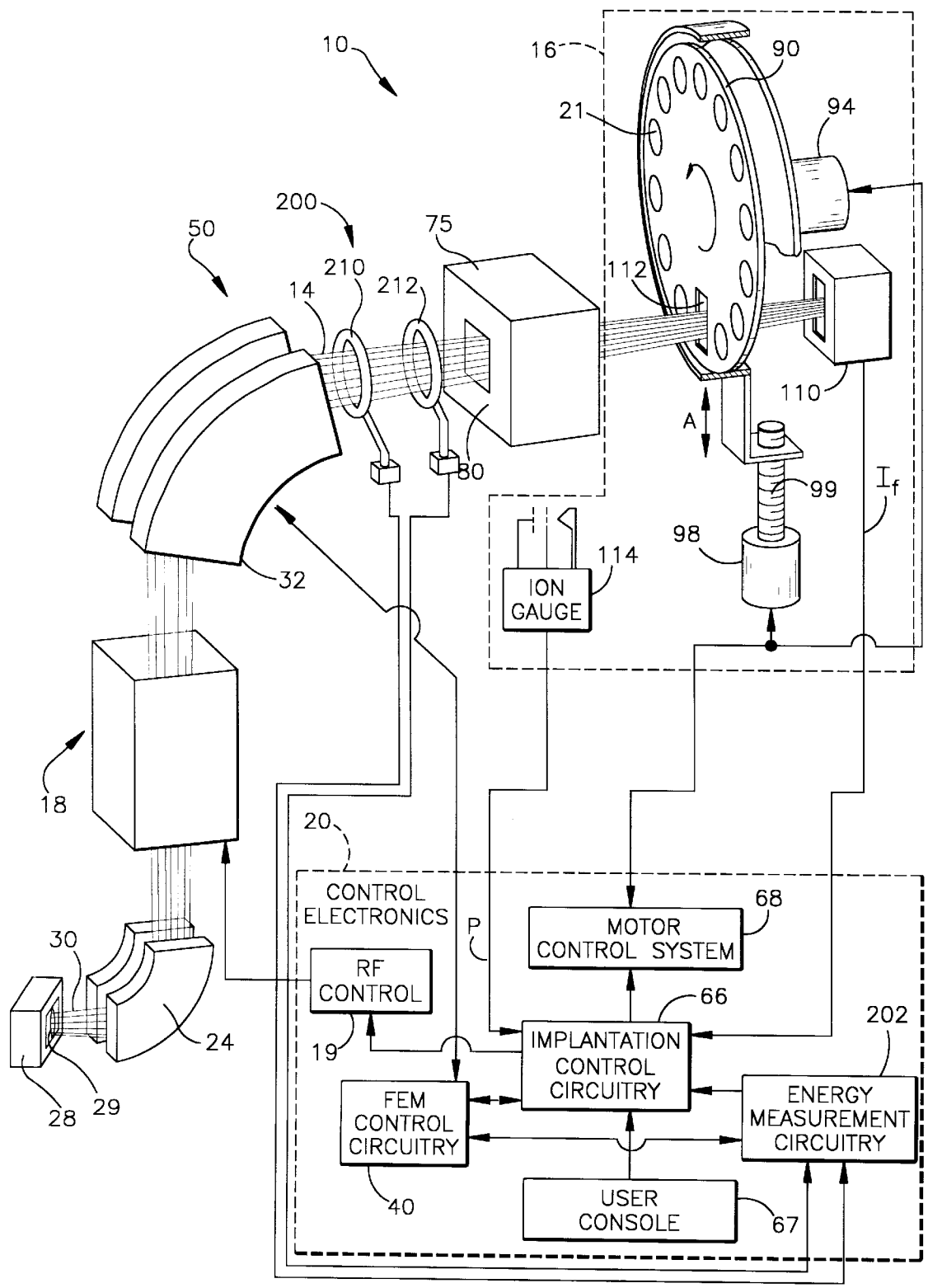
FIG. 2 is a schematic perspective view of selected components of the ion beam implanter of FIG. 1.

If a p type extrinsic material is to be produced, antimony, arsenic or phosphorus will be chosen as the solid source material. Energy is applied to the source materials to generate positively charged ions in the plasma chamber 28. As can be seen in FIG. 2, the positively charged ions exit the plasma chamber through an elliptical arc slit 29 in a cover plate 30 overlying an open side of the plasma chamber 28.

During a production run, that is, when semiconductor wafer workpieces 21 are being impinged upon by the ion beam 14 and thereby being implanted with ions, the ion beam 14 travels through an evacuated path through an interior region 52 (FIG. 1) defined by beam forming and directing structure 50 extending from the ion source 12 to an implantation chamber 22, which is also evacuated. Evacuation of the interior region 52 defining the beam path 14 during a production run is provided by a pump system comprising a system of vacuum pumps 31.

Ions in the plasma chamber 28 are extracted through the arc slit 29 of the plasma chamber cover plate 30 and are formed into the ion beam 14 that traverses the distance between the ion source 12 and the implantation station 16 by the beam forming and directing structure 50. The beam forming and directing structure 50 includes a mass analyzing or resolving magnet 24, the rf ion accelerator 18, a final energy magnet (FEM) 32 and a set of electrodes 34. The set of electrodes 34 extract the ions from the plasma chamber interior and accelerate the ions toward the mass analyzing magnet 24.

The mass analyzing magnet 24 is supported within a mass analyzing magnet housing 25 and an ion beam path 14 through the magnet region is bounded by an aluminum beam guide 26. The mass analyzing magnet 24 causes only those ions having an appropriate mass to charge ratio to reach the ion implantation station 16. The ionization of source materials in the plasma chamber 28 generates a species of positively charged ions having a desired atomic mass. However, in addition to the desired species of ions, the ionization process will also generate a proportion of ions having other than the proper atomic mass. Ions having an atomic mass above or below the proper atomic mass are not suitable for implantation.

The magnetic field generated by the mass analyzing magnet 24 causes the ions in the ion beam 14 to move in a curved trajectory. The magnetic field that is established by the control electronics 20 is such that only ions having an atomic mass equal to the atomic mass of the desired ion species traverse the curved beam path to the implantation station implantation chamber 22.

Ions with the desired atomic weight exit the mass analyzing magnet 24 and are accelerated to high velocity by modules 18a, 18b, 18c, 18d, 18e of the rf ion accelerator 18. The acceleration of ions to desired energy levels is controlled by rf control electronics 19. Importantly, the effect of the accelerator 18 is that the ion beam 14 is comprised of a series or train of ion pulses shown schematically as P0, P1, P2, P3, . . . , P(n−1), Pn, P(n+1) in FIG. 3. For energy analysis purposes, the beam 14 can be considered as a series of discrete ion pulses. Each ion pulse P0, P1, P2, P3, . . . , P(n−1), Pn, P(n+1) is comprised of a large number of individual ions, on the order of $10^{13}$ ions. Further, because of the characteristics of the ion accelerator 18, the frequency of the ion pulses comprising the ion beam 14 is a predetermined, known value. A typical value of frequency, f, for the ion accelerator is f=13.56 megahertz (MHz). This means the time period, T, between successive pulses, say P0 and P1, is T=1/f=1/13.56 MHz=73.75 nanoseconds (nsec).

After being accelerated by the ion accelerator 18, the beam 14 traverses a magnetic field generated by the FEM 32 operating under the control of FEM control circuitry 40 (shown schematically in FIG. 2). The FEM 32 is supported within a housing 33 and, like the mass analyzing magnet 24, includes an aluminum beam guide through which the ion beam 14 passes.

Ions that make up the ion beam 14 move from the ion source 12 into a magnetic field set up by the FEM 32. The strength and orientation of the magnetic field produced by the FEM 32 is controlled by FEM control circuitry 40 of the control electronics 20 by adjusting a current through the magnet's field windings. The FEM 32 provides an approximation of ion beam energy because the energy of the beam 14 is proportional to the magnetic energy necessary to bend the beam along the proper arcuate path such that the ion beam is directed to the target workpieces 21 in the implantation chamber 22. Thus, the FEM 32 selects certain ion beam energies by allowing only ions in a certain energy range or window to pass through the FEM. Therefore, the FEM 32 controls the implantation ion energy. The FEM control of energy typically is accurate to +/−10% of a desired ion beam energy.

Also part of the beam forming and directing structure 50 and located downstream from the FEM 32 is a quadrupole assembly 70, a resolving plate 80, a pivoting Faraday flag or cup 72 and an ion beam neutralizer 74. The quadrupole assembly 70 includes a set of electrodes oriented around the ion beam 14 which are selectively energized by the control electronics 20 to adjust the height of the ion beam 14. The quadrupole assembly 70 is supported within an implanter housing 75. Coupled to an end of the quadrupole assembly 70 facing the FEM 32 is the resolving plate 80 (FIG. 1). The Faraday flag 72 is pivotably coupled to the housing 75 so that it can be pivoted into position to intersect the ion beam 14 to measure beam characteristics and, when the measurements are satisfactory, swung out of the beam line so it does not interfere with wafer workpiece implantation at the implantation chamber 22.

The resolving plate 80 is comprised of vitreous graphite and defines an elongated aperture through which the ions in the ion beam 14 pass. Like the analyzing magnet 24, the FEM 32 also functions to eliminate undesirable ion species from the ion beam 14. As explained above, the strength and orientation of the FEM's magnetic field is established by the FEM control circuitry 40 and the control electronics 20 such that only ions having an atomic weight equal to the atomic weight of the desired species will traverse the predetermined, desired beam path to the implantation station 16. Undesirable species of ions having an atomic mass much larger or much smaller than the desired ion atomic mass are sharply deflected and impact the aluminum beam guide 42 or the slit boundary defined by the resolving plate 80.

The beam forming and directing structure 50 also includes the beam neutralizer 74, commonly referred to as an electron shower. The ions extracted from the plasma chamber 28 are positively charged. If the positive charge on the ions is not neutralized prior to implantation of the wafers, the doped wafers will exhibit a net positive charge. Such a net positive charge on a wafer workpiece has undesirable effects. The electrons generated by the ion neutralizer 74 are swept downstream along the ion beam beam line 14 providing a neutral space-charge density downstream of the ion beam neutralizer 74.

Directly upstream of the ion beam neutralizer 74 is a magnetic repeller 82. The repeller 82 includes permanent magnets for inhibiting backstreaming of electrons from the neutralizer 74. The neutralizer 74 and repeller 82 are formed as an integral unit and are supported by the housing a common base 85 of the implanter housing 75. A suitable ion neutralizer and magnetic repeller are disclosed in U.S. Pat. No. 5,691,537 to Chen et al. and assigned to the assignee of the present invention. U.S. Pat. No. 5,691,537 is incorporated in its entirety herein by reference.

A downstream end of the ion beam neutralizer 74 is adjacent the implantation chamber 22 where the semiconductor wafer workpieces 21 are implanted with ions. Supported within the implantation chamber is a disk-shaped semiconductor wafer workpiece support 90. Wafer workpieces 21 to be treated are positioned near an outer edge of the wafer support 90 and the support is rotated at a constant angular velocity by a motor 92. An output shaft of the motor 92 is coupled to a support drive shaft 94 by a belt 96. Alternately, the support drive shaft 94 of the wafer support 90 may be directly coupled to the output shaft of the motor 92. The ion beam 14 strikes the wafer workpieces as they rotate in a circular path at a rate of about 1200 RPM. A stepper motor 98 also drives a lead screw 99 to translate the support 90 vertically (shown by arrow labeled "A" in FIG. 2). This permits multiple rows of semiconductor wafers to be implanted during a production run. The workpieces 21 are loaded and unloaded through a load lock to allow the beam line to remain evacuated during loading and unloading. The implantation station 16 is pivotable with respect to the beam neutralizer housing 75 by a flexible bellows 100 (FIG. 1). The ability to pivot the implantation station 16 permits adjustments to the angle of incidence of the ion beam 14 as the beam impacts wafers within the implantation chamber 22. A Faraday cage 110 is mounted behind the workpiece support 90 and is used to measure the Faraday ion beam current, $I_f$, which passes through a slot 112 formed in the support 90.

The control electronics 20 includes dosage control circuitry 66 that controls ion dosage received by the workpieces 21 and ion implantation depth. The dosage control circuitry 66 receives inputs regarding pressure, P, in the implantation chamber 22 from an ion gauge 114 in chamber 22 and the Faraday ion beam current, $I^f$, from the Faraday cage 110 (FIG. 2). To control for dosage of the workpieces 21, the dosage control circuitry 66 controls the motor control system 68 to adjust the angular velocity and the vertical movement of the support 90. To control for the ion implantation depth of the workpieces 21, the dosage control circuitry 66 controls the rf control circuitry 19 to adjust the energy of the ion beam 14.

Time of flight energy measurement assembly 200—First embodiment

Figure 3:
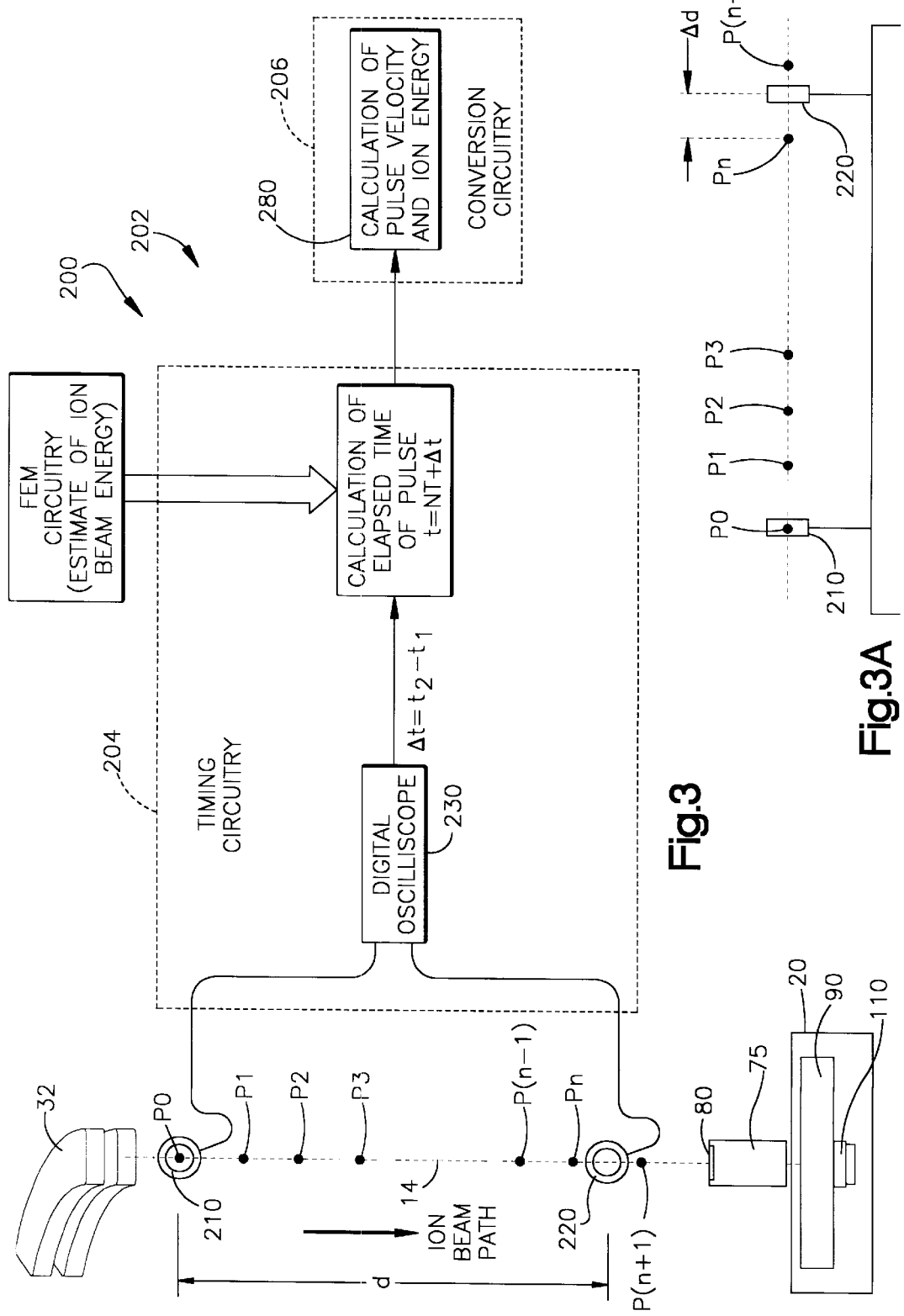
FIG. 3 is a schematic block diagram of selected circuitry of a first embodiment of an energy measurement apparatus of the present invention.

The first preferred embodiment of a novel ion beam time of flight energy measurement apparatus or assembly of the ion beam implanter 10 is shown generally at 200 in FIG. 3. The time of flight energy measurement apparatus 200 functions to continually measure the energy of the ion beam 14. This permits accurate control of ion implantation depth by the control electronics 20. As is typical in the art, "the energy of the ion beam" is actually not measured, instead the apparatus 200 functions to continuously measure the average kinetic energy of an ion of the desired ion species in the ion beam 14. The average kinetic energy of an ion is calculated based on the average velocity of an ion pulse when traversing a predetermined distance, d, between first and second sensors 210, 220 of the apparatus 200. The energy measurement apparatus 200 of the present invention measures the average kinetic energy of an ion in the ion beam 14 about 20 times per second.

The ion beam energy measurement provided by the ion beam measurement apparatus 200 of the present invention is capable of being nearly instantaneously updatable and for a 1 megaelectron volts (MeV) boron ion beam with a 1 nsec. timing resolution, is accurate to within +/−0.5% of the true energy value of one ion of the ion beam 14. Further, since the ion beam energy measurement accomplished by the energy measurement apparatus 200 takes place in an interior region of the implanter 10 where pressure does not change significantly during a production run, the time-of-flight sensor signals can advantageously serve as a pressure independent monitor of ion beam current or Faraday current, $I_f$ (shown schematically in FIG. 2).

The ion beam measurement apparatus 200 is based on a time of flight (TOF) technique which is appropriate because a high energy ion beam (i.e., greater than 90 keV) can be accurately modeled as a series of ion pulses, three of which are shown schematically as P0, P1, P2, P3. The TOF technique determines the velocity of an ion pulse based on the elapsed time for the pulse to traverse the predetermined distance between the first and second sensors 210, 220. The sensors 210, 220 are disposed a predetermined distance apart (for example, 25 centimeters (cm.)) and positioned adjacent the ion beam beam line 14. Advantageously, the ion beam measurement apparatus 200 receives a rough estimate of beam energy from the FEM control circuitry 40 (accurate to within +/−10% of true beam energy).

The apparatus 200 takes advantage of the fact that the ion accelerator 18 generates a series of beam pulses at a constant frequency. For a 2.5 MeV boron ion beam, a typical frequency, F, is F=13.56 MHz. Thus, the period, T, between adjacent pulses in the beam line is the reciprocal of the frequency:

$$T = 1/F$$
$$= 1/13.56 \text{ MHz.}$$
$$= 73.75 \text{ nsec.}$$

In addition to the first and second sensors 210, 220, the apparatus 200 includes energy measurement circuitry 202. The energy measurement circuitry 202 includes timing circuitry 204 for determining the time, t, for an ion pulse to traverse the distance, d, between the first and second sensors 210, 220 and conversion circuitry 206 for determining the energy of an ion in the ion beam 14.

The timing circuitry 204 first determines the delay time, Δt, between a first pulse passing the first sensor 210 and a second pulse passing the second sensor 220. That is, looking at FIGS. 3 and 3A, at time t1, the pulse P0 passes through the first sensor 210 and the pulse Pn is approaching the second sensor 220. At time, t2, the pulse Pn passes through the second sensor 220. The delay time, Δt, is equal the time for pulse Pn to travel the distance labeled Δd in FIG. 3A, that is, Δt=t2−t1.

Figure 7A:
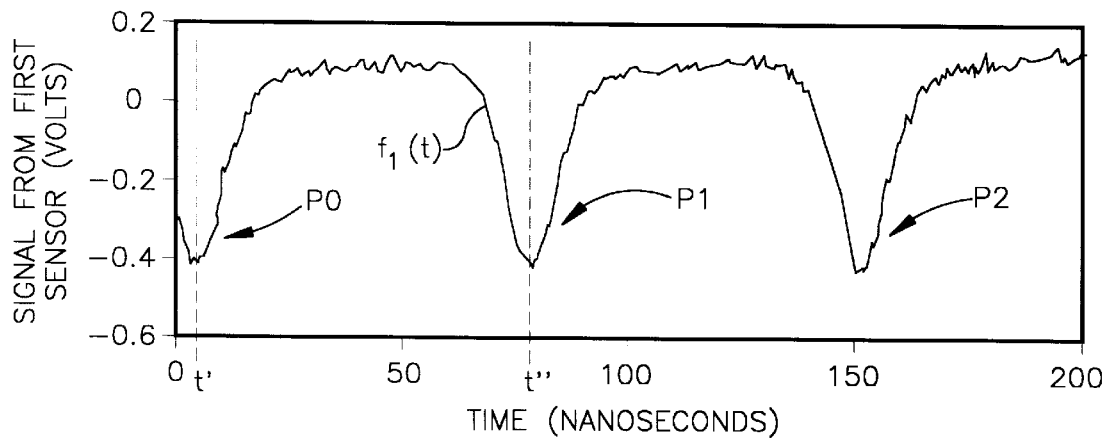
FIG. 7A is a representation of a digitized oscilloscope trace showing waveforms resulting from successive ion pulses passing the first sensor.
Figure 7B:
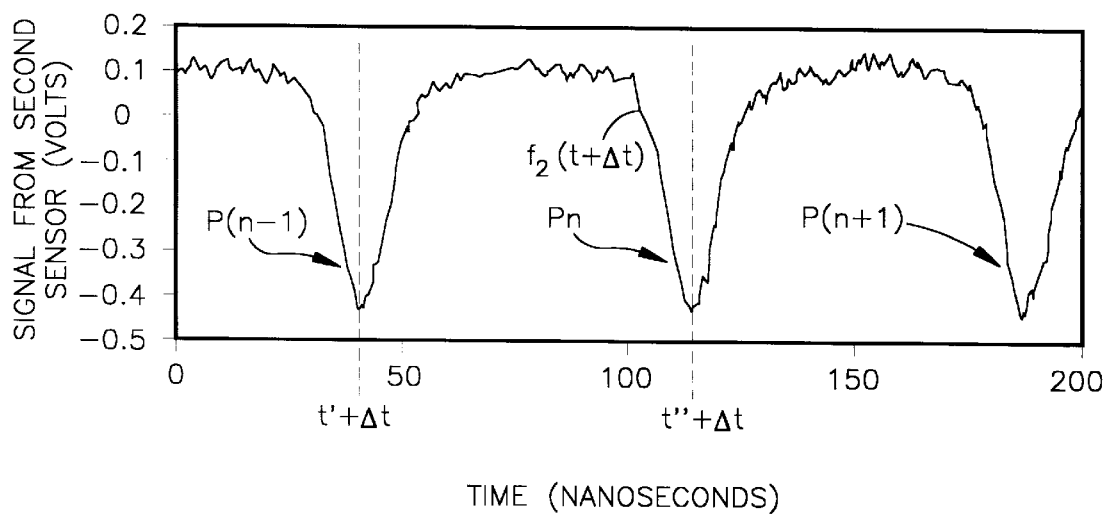
FIG. 7B is a representation of a digitized oscilloscope trace showing waveforms resulting from successive ion pulses passing the second sensor.

Operatively, a dual channel digital oscilloscope 230 is used and digitized waveforms of the type shown in FIGS. 7A and 7B are generated when pulses P0, P1, P2 pass through the first sensor 210 (FIG. 7A) and when pulses P(n−1), P(n), P(n+1) pass through the second sensor 220 (FIG. 7B). The digitized data is used to calculate the cross-correlation value, C(Δt), as a function of delay time, Δt, as follows:

$$C(\Delta t) = \int_{t'}^{t''} [f1(t) \times f2(t+\Delta t)] dt$$

where:

f1(t)=the digitized data representing the waveform signal generated by the pulse P0 passing the first sensor 210;

f2(t)=the digitized data representing the signal generated by the pulse Pn passing the second sensor 220;

t'=the time at which the waveform signal generated by pulse P0 begins; and t''=the time at which the waveform signal generated by pulse P0 ends.

To find the best approximation of delay time, Δt, different values of delay time ranging from 0.0 nsec. to time T (the period between pulses, 73.75 nsec.) are inserted into the integral by the timing circuitry 204 and the value of delay time, Δt, between 0.0 and 73.75 nsec. that maximizes the cross-correlation value, C(Δt), is selected as the best approximation of delay time by the timing circuitry 204. This methodology of determining the delay time is robust in that it is less effected by the particular shape of the waveform signals generated by the sensors 210, 220. Further, this methodology is accurate for determining delay time even when the waveform signals have a low signal-to-noise ratio. In contrast, time delay measurements using level crossing methods tend to be corrupted for waveforms with slow rise times or with low signal-to-noise ratios.

Knowing the period between successive pulses and based on an approximation of pulse velocity from the FEM control circuitry 40, the elapsed time, t, of the selected pulse P0 traversing the distance between the first and the second sensors is calculated by the timing circuitry 204 using an appropriate algorithm. The algorithm, not including calibration corrections described below, is as follows:

$$t = t(\text{offset}) + \Delta t$$
$$= [N \times (1/F)] + \Delta t$$
$$= [N \times T] + \Delta t$$

where:

t(offset)=an offset time for the selected pulse to traverse a distance less than the predetermined distance, d, between the first and second sensors;

N=the expected integer number of pulses between the first and second sensors;

F=the frequency of the ion pulses;

T=the time period between the ion pulses.

As explained above, the time period, T, between pulses is known (T=73.75 nsec.) because the frequency of pulses is known from the rf ion accelerator 18. The number of pulses, N, between the first and second sensors is known based on the FEM energy approximation. An empirical chart is shown in FIG. 8 for an arsenic (+) ion beam, a phosphorous (+) ion beam and a boron (+) ion beam. For example, if a 500 keV phosphorous ion beam is generated, the number of pulses, N, is N=2. The number found from the chart is always rounded down to the next integer value, that is, if the chart N value is 2.8, the N value used would be N=2.

Data corresponding to an empirical chart of N values such as shown in FIG. 8 can be generated and input to a memory accessible by the timing circuitry 204. The timing circuitry 204 would access the data to determine an appropriate value of N depending on the composition of the ion beam 14 and the desired beam energy. Alternately, the timing circuitry 204 may calculate the expected number of pulses, N, between the first and second sensors 210, 220 directly knowing the time period, T, between successive ion pulses and determining the estimated time for a pulse to traverse the predetermined distance, d, based on the FEM energy approximation. That is, based on the FEM energy approximation, the timing circuitry 204 can calculate an estimated velocity of an ion pulse and thus an estimated time for the pulse to traverse the predetermined distance, d, between the first and second sensors 210, 220.

Once the elapsed time, t, of the pulse P0 traversing the distance between the first and the second sensors is accurately known, the conversion circuitry 206 calculates the velocity of the pulse P0 as follows: v(pulse P0)=d/t, where d is the distance between the first and second sensors 210, 220. Finally, the conversion circuitry 206 calculates the energy of an ion, E(ion), in the pulse P0 using the equation: E(ion)=½m(ion)v², where m is the mass of an ion of the desired ion species in the beam 14.

Calibration Procedures

Calibration procedures are required to ensure that the energy measurement apparatus 200 is measuring the correct and accurate energy of the ion beam 14. There are four calibration procedures or techniques that can advantageously be utilized by the apparatus 200 either separately or in combination. The calibration procedures include:

1) balanced signal technique;
2) verification using the speed of light technique;
3) insertion of a known delay line technique; and/or
4) use of DC-beams of known energy technique.

All of these techniques, with the exception of DC beams, use an external signal injected into the two time-of-flight sensors 210, 220 from a separate signal generator.

1) The balanced signal technique uses a single signal that is split with a balanced splitter in between the two sensors 210, 220, and the signals are then sent into the two sensors along cables with identical lengths. The result is two signal outputs from the two sensors, 210, 220 with zero delay between them. Measurement of a finite delay between the two sensor outputs in this case indicates that there is some timing imbalance between the two channels used to measure the individual signals. The result of the "balance" measurement is therefore a constant timing offset that is included in the algorithm used to calculate the beam energy from the measured average ion pulse or bunch velocity.

2) Verification using the speed-of-light technique uses a signal propagating along a rigid coaxial cable with a velocity close to the speed of light. The cable is inserted through the two sensors 210, 220 in such a manner that the sensors produce pulse signals each time the propagating signal on the cable passes the sensor. The time delay that should be measured in this case is Δt=d/c, where c is the speed of light in the coaxial cable. If the measured time is different than this value, it indicates that the distance, d, between the two sensors 210, 220 has changed from its nominal value, and a new value is found from the calibration procedure, and subsequently used in later energy measurements. This method is easily implemented on a bench-top system so that the effective distance between the two sensors 210, 220 can be verified before the time-of-flight apparatus 200 is installed in the implanter 10 along the beamline 14.

3) The insertion of a known delay line technique is similar to the speed of light measurement technique described above, but in this case, a cable with a known delay time is positioned between the two probes. (The accurate delay time on a cable is easily and accurately measured using a network analyzer.) A signal is input to the cable with the delay line and the time delay between the two sensor output signals is measured. If the measured time delay is different than the expected delay time, it indicates there is some timing imbalance between the two analysis channels, and a correction factor is then incorporated into the algorithm to calculate energy from the time delay.

4) The DC-beam calibration technique uses ion beams that are accelerated solely by a DC voltage applied to the extraction electrodes 34 of implanter ion source 12. The energy of such a beam is known to within the accuracy of the voltage applied to the extraction electrodes 34. A small RF signal is imposed on the DC beam by applying a small RF voltage on one of the electrodes within one of the modules 18a, 18b, 18c, 18d, 18e of the ion accelerator 18. Small RF modulations on a DC beam do not change the average energy of the beam. By measuring multiple DC ion beam energies with the time-of-flight apparatus 200, an expected time delay, t(expected) (for a given species) is available for accurate system calibration. The formula for t(expected) is: t(expected)=d/v, where d is the distance between the first and second sensors 210, 220 and v is the velocity of ions in the DC ion beam.

First sensor operating embodiment (inductive-type sensor)

A first preferred operating embodiment of the ion beam energy measurement assembly 200 includes first and second inductive-type sensors 210, 220 (FIG. 5) electrically coupled to the energy measurement circuitry 202 (FIG. 3) and particularly the digital oscilloscope 230.

The first sensor 210 and the second sensor 220 are spaced apart by a predetermined, known distance, such as 25 cm., and are positioned adjacent the ion beam 14 downstream of the FEM 32 and upstream of the implantation chamber 22.

The inductive sensor 210 includes a conductor 214 wrapped around a core material with high magnetic permeability 212. Preferably, the sensor 210 is ring-shaped and is positioned so that the ion beam beam line 14 passes through the sensors shown in FIG. 6. The inductive sensor 210 is affixed to a support member 218. The support member 218 is bolted using bolt 219 to an appropriate interior portion of the FEM housing 33 to support the sensor 210 in a proper position with respect to the ion beam beam line 14. A second inductive sensor (not shown) is similarly bolted to an appropriate interior portion of the beam forming and directing structure 50 downstream of the first sensor 210.

The inductive sensor has the advantage of being insensitive to space-charge neutralization effects as compared to capacitive-type sensors.

Second sensor embodiment (capacitive-type sensor)

A second preferred operating embodiment of the ion beam energy measurement assembly 200 includes first and second capacitive-type sensors 310, 320 (FIG. 6) electrically coupled to the energy measurement circuitry 202. The first and second sensors 310, 320 are identical in structure so only the first sensor 310 will be discussed in detail. Turning to FIG. 6, the first sensor 310 is comprised of a J-shaped glass tube 312 made of a highly insulating material such as glass and having an arcuate upper portion 313. The sensor 310 is positioned such that the arcuate upper portion 313 partially encircles the ion beam 14. The tube 312 has a longitudinal central opening 314 through which a conductive lead 316 extends. One end of the conductive lead 316 terminates at a distal end 317 of the arcuate upper portion 313 while the other end of the conductive lead 316 is coupled to the oscilloscope 230. The conductive lead 316 functions as a negative plate or cathode of a capacitor while the ion beam 14 functions as positive plate or anode. As the current of the ion beam 14 changes, the charge on the negative plate changes. The conductive lead 316 is appropriately discharged through the energy measurement circuitry 202. The negative capacitive pick-up of the first sensor 310 is sensitive to the electric field of the ion beam 14.

Figure 4:
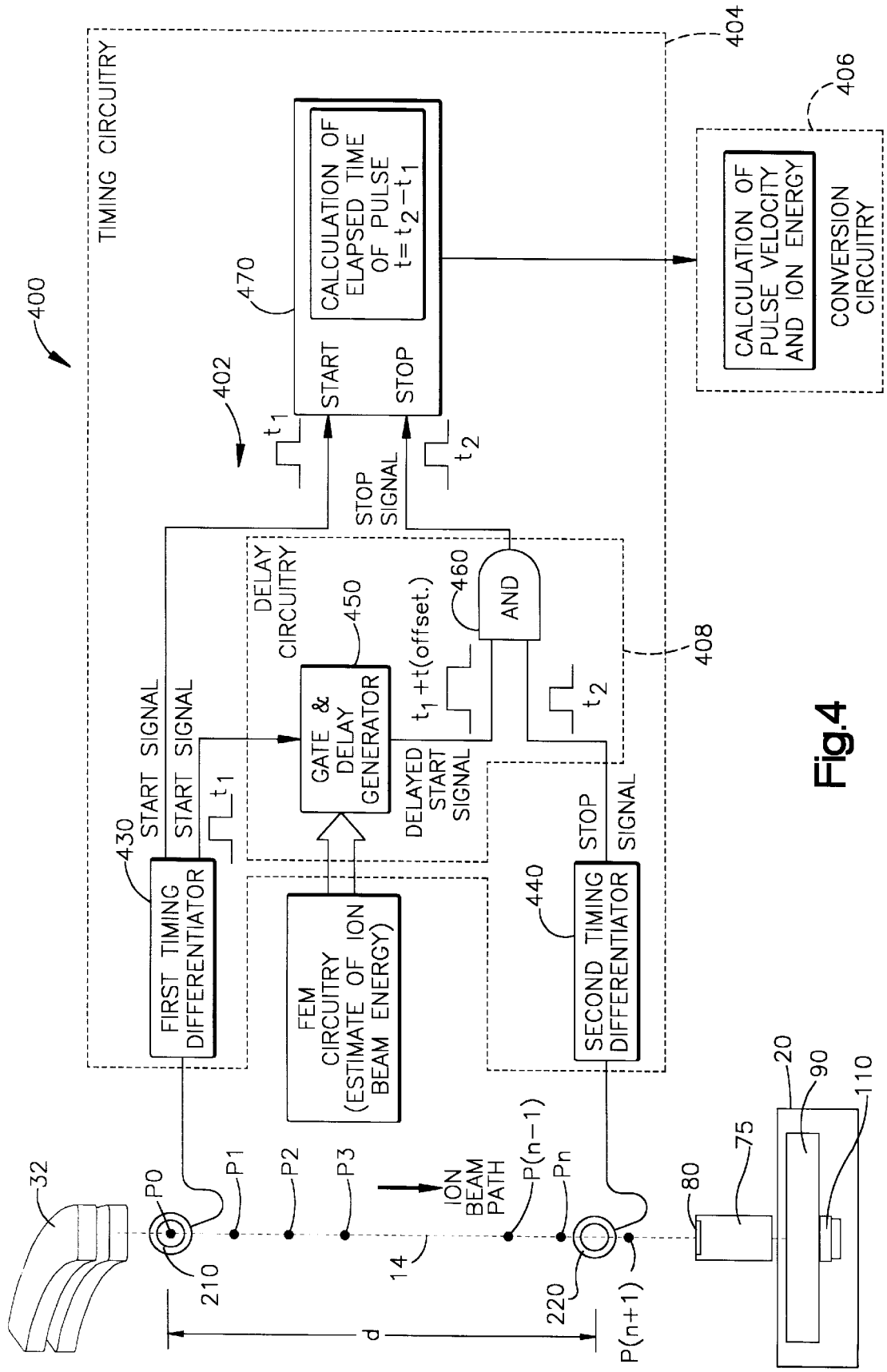
FIG. 4 is a schematic block diagram of selected circuitry of a second embodiment of an energy measurement apparatus of the present invention.

As can be seen in FIG. 4, the first capacitive sensor 310 is affixed to a support member 318. The support member 318 is bolted using a bolt 319 to an appropriate interior portion of the FEM housing 33 to support the sensor 310 in a proper position with respect to the ion beam 14. The second capacitive sensor 320 is similarly bolted to an appropriate interior portion of the beam forming and directing structure 50 downstream of the first sensor 310. This sensor embodiment has the advantage of being more sensitive than the inductive-type sensor.

Time of flight energy measurement assembly 400—Second embodiment

A second preferred embodiment of the energy measurement assembly of the present invention is shown generally at 400 in FIG. 4. The timing circuitry 404 includes a delay circuit 408 for calculating an approximate delay period for an ion pulse to traverse the distance, d, between the first and second sensors 210, 220. The first and second sensors have the same configuration as described in the previous embodiment. The calculated delay period is used by the delay circuit to insure that a single ion pulse is timed by the timer 470 of the timing circuitry 404.

The first sensor 210 and the second sensor 220 are spaced apart by 25 cm. and are positioned adjacent the ion beam 14. The first sensor 210 is positioned just downstream of the FEM 32 while the second sensor 220 is disposed 25 cm. downstream of the first sensor 210. When an ion pulse such as the pulse P0 passes the first sensor 210, the sensor generates a bipolar signal with a well defined zero crossing. The first timing differentiator 430 preferably includes an operational amplifier, such as the Fairchild $\mu$A 741 operational amplifier, configured as a zero crossing detector. When the output of the first sensor 210 crosses zero volts, the first timing differentiator 430 generates a signal. Thus, as each pulse P0, P1, P2, P3 etc. traveling down the beam path 14 passes the first sensor 210, the first timing differentiator 430 generates a start signal (FIG. 3). The start signals generated by the first timing differentiator 430 are input to a timer 470, such as a time to pulse height converter, of the timing circuitry 404 and to a gate and delay generator 450 of the delay circuit 408.

Similarly, a second timing differentiator 440, similar in structure to the first timing differentiator 430, is electrically coupled to the second sensor 220. As each ion pulse traveling down the beam path 14 passes the second sensor 220, the second timing differentiator 440 generates an stop signal. The signals generated by the second timing differentiator 440 are input to an AND gate 460 of the delay circuit 408. The gate and delay generator 450 receives data from the FEM control circuitry 40 providing an approximate measure of the energy of the ion beam 14.

The gate and delay generator 450 utilizes the approximate measure of the ion beam energy from the FEM 32 to calculate an approximate offset time, t(offset), for an ion pulse, that is, an estimate of how long it would take an ion pulse to traverse the distance, d, between the first and second sensors 210, 220 given the approximate energy of the ion beam 14 reduced by a predetermined factor. For example, the approximate energy measure of the FEM could be used to determine an estimated elapsed time, t(est.), for an ion pulse to traverse the distance, d, between the first and second sensors 210, 220. The gate and delay generator 450 would convert the estimated beam energy E(approx.) to velocity of an ion pulse v(pulse). Since the distance, d, between the first and second sensors 210, 220 is known, the pulse velocity, v(pulse), is then used by the gate and delay generator 450 to determine the estimated elapsed time, t(est.), using the equation: t(est.)=d/v(pulse). Then, the estimated time, t(est.), is reduced by some percentage, for example, by 10%, to generated the offset time t(offset). The offset time, t(offset), can be considers as an elapsed time for the pulse to travel a distance somewhat less than the distance d between the first and second sensors 210, 220. This "underestimation" inherent in t(offset) avoids "missing" the selected ion pulse as it passes the second sensor 220.

For a selected ion pulse, say P0, the first timing differentiator 430 generates a start signal when the pulse passes the first sensor 210 at time $t_1$ (i.e., at the position shown in FIG. 3). The start signal is input to a start input of the timer 470 at time $t_1$ to start the elapsed time for the selected pulse. The start signal is also input to the gate and delay generator 450 at time $t_1$. The gate and delay generator 450 delay the start signal by a time equal to the calculated estimated offset time, t(offset), and then output a logic high signal which can be thought of as a delayed start signal. The delayed start signal is input to a first input of the AND gate 260 at time $t_1$+t(offset) causing the input to latch logic high.

The next stop signal generated by the second timing differentiator 440 at time $t_2$ which occurs just after the first input of the AND gate 460 is switched to logic high (at time $t_1$+t(offset)) corresponds to the selected ion pulse P0 passing the second sensor 220. The stop signal generated at time $t_2$ causes a second input of the AND gate 460 to go logic high. Since both AND gate inputs are high, a logic high stop signal is output from the AND gate 460 at time $t_2$ and is coupled to a stop input of the timer 470. The stop signal causes the timer 470 to stop the elapsed time for the selected pulse. The elapsed time, t, for the selected pulse P0 to traverse the distance, d, between the first and second sensors 210, 220 is equal to: $t=t_2-t_1$.

An alternate way of the gate and delay generator 450 operating to delay the start signal for a selected ion pulse is to use an empirical chart such as the one shown in FIG. 8 to determine an offset time, t(offset)=N×T, where N is the number of pulses that must be input to the gate and delay generator 450 before the output of the generator is switched to logic high and T is the period between consecutive ion pulses. As was explained above, data corresponding to the empirical chart shown in FIG. 8 is stored in a memory and is used by the timing circuitry 404 to determine N, that is, how many ion pulses to "ignore" before the gate and delay generator 450 is switched to logic high. For example, if a 500 keV phosphorous ion beam is generated, the gate and delay generator 450 waits for N=2 successive radio frequency (rf) cycles or counts generated by the first sensor 210 as a result of ion pulses P1 and P2 passing the sensor 210 subsequent to the selected ion pulse P0 passing the sensor 210. After two cycles have passed, that is, two start signals subsequent to the selected start signal have been generated by the first timing differentiator 230, then the gate and delay generator 450 switches to a logic high output.

Assuming that the period between successive ion pulses (rf cycles) is 73.75 nsec., the first timing differentiator 430 would generate a start signal approximately every 73.75 ns. A delay of N=2 cycles would cause an offset time, t(offset), of t(offset)=2 cycles×73.75 ns.=147.5 nsec. after an ion pulse start signal is received from the first timing differentiator 430. The gate and delay generator 450 would only generate a logic high output after receiving two start signals subsequent to a selected start signal (corresponding to a selection ion pulse). This pulse counting by the gate and delay generator 450 would enable a logic high output from the AND gate 460 upon receipt of the next stop signal from the second timing differentiator 440.

The conversion circuitry 406 (FIG. 4) including a multichannel analyzer (MCA) convert the elapsed time, t, of the selected ion pulse P0 to an energy of an ion, E(ion), of the ion pulse P0. The velocity, v(pulse) of the selected pulse P0 of the ion beam 14 is determined by the conversion circuitry

406 using the formula, v(pulse)=d/t, where d=distance between the first and second sensors and t=elapsed time for the pulse to travel from the first sensor 210 to the second sensor 220. Once the velocity of the pulse, v(pulse) is determined, the energy of an ion in the pulse, E(ion), is determined as set forth in the first embodiment described above.

While the invention has been described herein in its currently preferred embodiment of embodiments, those skilled in the art will recognize that other modifications may be made without departing from the invention and it is intended to claim all modifications and variations as fall within the scope of the invention.

We claim:

1. An ion beam implanter for directing an ion beam against a workpiece, the implanter comprising:
   a) an implantation station defining an implantation chamber, the workpiece supported within the implantation chamber;
   b) an ion source and ion acceleration assembly generating the ion beam, the ion beam comprising a series of ion pulses, the pulses spaced apart by a predetermined period, T, and traversing an interior region of the ion implanter extending from an ion source to the implantation chamber; and
   c) a time of flight energy measurement apparatus for measuring an average kinetic energy of an ion included in a selected ion pulse of the ion beam, the energy measurement apparatus including:
      1) a first sensor and a second sensor disposed adjacent the ion beam and spaced a predetermined distance apart, the second sensor being downstream of the first sensor, the first sensor generating a signal when an ion pulse of the ion beam passes the first sensor and the second sensor generating a signal when an ion pulse of the ion beam passes the second sensor;
      2) timing circuitry electrically coupled to the first and second sensors and;
         a) calculating an average number of ion pulses, N, in the ion beam between the first and second sensors based on the approximation of the ion beam energy;
         b) calculating an offset time, t(offset), for the selected ion pulse using the formula, t(offset)= N×T; and
         c) determining an elapsed time, t, for the selected ion pulse to traverse the predetermined distance between the first and second sensors utilizing the signals generated by the first and second sensors and the calculated offset time t(offset); and
      3) conversion circuitry for converting the elapsed time, t, for the selected ion pulse into a measure of the energy of the ion beam.

2. The ion beam implanter of claim 1 wherein the implanter includes a final energy magnet which applies a magnetic field to the ion beam to curve the ion beam along a predetermined arcuate path toward the implantation station and includes circuitry generating the approximation of the ion beam energy based on the magnitude of the magnetic field applied.

3. The ion beam implanter of claim 1 wherein the timing circuitry includes a digital oscilloscope and the signals generated by the first and second sensors are coupled to the oscilloscope.

4. The ion beam implanter of claim 3 wherein the timing circuitry:
   a) determines a delay time, $\Delta t$, between a time at which the selected ion pulse passes the first sensor and an earliest subsequent time at which a next ion pulse passes the second sensor; and
   b) calculates the elapsed time, t, for the selected pulse using the formula:

$$t=[N \times T]+\Delta t.$$

5. The ion beam implanter of claim 4 wherein the timing circuitry determines the delay time, $\Delta t$, by selecting a value of delay time from a set of delay time values that maximizes a cross correlation function value applied to digitized data representing the signals generated by the first and second sensors.

6. The ion beam implanter of claim 1 wherein the first and second sensors are capacitive sensors, each sensor having a metallic core which functions as the cathode of a capacitor with the ion beam functioning as the anode.

7. The ion beam implanter of claim 1 wherein the first and second sensors are inductive sensors.

8. An ion beam implanter for directing an ion beam against a workpiece, the implanter comprising:
   a) an implantation station defining an implantation chamber, the workpiece supported within the implantation chamber;
   b) an ion source and an ion acceleration assembly generating the ion beam, the ion beam comprising a series of ion pulses, the pulses spaced apart by a predetermined period, T, and traversing an interior region of the ion implanter extending from an ion source to the implantation chamber; and
   c) a time of flight energy measurement apparatus for measuring an average kinetic energy of an ion included in a selected ion pulse of the ion beam, the energy measurement apparatus including:
      1) a first sensor and a second sensor disposed adjacent the ion beam and spaced a predetermined distance apart, the second sensor being downstream of the first sensor, the first sensor generating a signal when an ion pulse of the ion beam passes the first sensor and the second sensor generating a signal when an ion pulse of the ion beam passes the second sensor;
      2) timing circuitry electrically coupled to the first and second sensors and calculating an offset time, t(offset), based on an approximation of ion beam energy, the timing circuitry including a first timing differentiator, a second timing differentiator and a delay circuit;
         i) the first timing differentiator electrically coupled to the first sensor and generating a first signal when a signal is received from the first sensor;
         ii) the second timing differentiator electrically coupled to the second sensor and generating a second signal when a signal is received from the second sensor;
         iii) the delay circuit electrically coupled to the first and second timing differentiators, the delay circuit receiving the first and second signals generated by the differentiators and the offset time, t(offset), and generating a start signal and a stop signal as follows:
            A) generating the start signal when a signal is received from the first timing differentiator corresponding to the selected ion pulse passing the first sensor;
            B) waiting a period time equal to the offset time, t(offset); and
            C) subsequent to expiration of the period of time equal to the offset time, generating a stop signal when a next signal is received from the second timing differentiator corresponding to an ion pulse passing the second sensor;

iv) the timing circuitry utilizing the start and stop signals to calculate an elapsed time, t, for the selected ion pulse to traverse the predetermined distance between the first and second sensors; and 3) conversion circuitry for converting the elapsed time, t, for the selected ion pulse into a measure of the energy of the ion beam.

9. The ion implanter of claim 8 wherein the timing circuitry further includes a timer electrically coupled to the first timing differentiator.

10. The ion implanter of claim 8 wherein the first and second sensors are capacitive sensors, each sensor having a metallic core which functions as the cathode of a capacitor with the ion beam functioning as the anode.

11. The ion implanter of claim 8 wherein the first and second sensors are inductive sensors.

12. The ion implanter of claim 8 wherein the first and second timing differentiators are zero crossing discriminators.

13. A time of flight ion beam energy measurement assembly for measuring an average kinetic energy of an ion included in a selected ion pulse of an ion beam of an ion beam implanter, the energy measurement assembly comprising:

a) a first sensor and a second sensor disposed adjacent the ion beam and spaced a predetermined distance apart, the second sensor being downstream of the first sensor, the first sensor generating a signal when an ion pulse of the ion beam passes the first sensor and the second sensor generating a signal when an ion pulse of the ion beam passes the second sensor;

b) timing circuitry electrically coupled to the first and second sensors and:

1) calculating an average number of ion pulses, N, in the ion beam between the first and second sensors based on the approximation of the ion beam energy;

2) calculating an offset time, t(offset), for the selected ion pulse using the formula, t(offset)=N×T; wherein T is a predetermined period spaced between the ion pulses; and 3) determining an elapsed time, t, for the selection ion pulse to traverse the predetermined distance between the first and second sensors utilizing the signals generated by the first and second sensors and the calculated offset time t(offset); and c) conversion circuitry for converting the elapsed time, t, for the selected ion pulse into a measure of the energy of the ion beam.

14. The energy measurement assembly of claim 13 wherein the timing circuitry includes a digital oscilloscope and the signals generated by the first and second sensors are coupled to the oscilloscope.

15. The energy measurement assembly of claim 14 wherein the timing circuitry:

a) determines a delay time, $\Delta t$, between a time at which the selected ion pulse passes the first sensor and an earliest subsequent time at which a next ion pulse passes the second sensor; and b) calculates the elapsed time, t, for the selected pulse using the formula:

$t=[N \times T]+\Delta t$.

16. The energy measurement assembly of claim 15 wherein the timing circuitry determines the delay time, $\Delta t$, by selecting a value of delay time from a set of delay time values that maximizes a cross correlation function value applied to digitized data representing the signals generated by the first and second sensors.

17. The energy measurement assembly of claim 13 wherein the first and second sensors are capacitive sensors, each sensor having a metallic core which functions as the cathode of a capacitor with the ion beam functioning as the anode.

18. The energy measurement assembly of claim 13 wherein the first and second sensors are inductive sensors.

19. A time of flight ion beam energy measurement assembly for measuring an average kinetic energy of an ion included in a selected ion pulse of an ion beam of an ion beam implanter, the energy measurement assembly comprising:

a) a first sensor and a second sensor disposed adjacent the ion beam and spaced a predetermined distance apart, the second sensor being downstream of the first sensor, the first sensor generating a signal when an ion pulse of the ion beam passes the first sensor and the second sensor generating a signal when an ion pulse of the ion beam passes the second sensor;

b) timing circuitry electrically coupled to the first and second sensors and calculating an offset time, t(offset), based on an approximation of ion beam energy, the timing circuitry including a first timing differentiator, a second timing differentiator and a delay circuit:

1) the first timing differentiator electrically coupled to the first sensor and generating a first signal when a signal is received from the first sensor;

2) the second timing differentiator electrically coupled to the second sensor and generating a second signal when a signal is received from the second sensor;

3) the delay circuit electrically coupled to the first and second timing differentiators, the delay circuit receiving the first and second signals generated by the differentiators and the offset time, t(offset), and generating a start signal and a stop signal as follows:

i) generating the start signal when a signal is received from the first timing differentiator corresponding to the selected ion pulse passing the first sensor;

ii) waiting a period time equal to the offset time, t(offset); and iii) subsequent to expiration of the period of time equal to the offset time, generating a stop signal when a next signal is received form the second timing differentiator corresponding to an ion pulse passing the second sensor;

4) the timing circuitry utilizing the start and stop signals to calculate an elapsed time, t, for the selected ion pulse to traverse the predetermined distance between the first and second sensors; and c) conversion circuitry for converting the elapsed time, t, for the selected ion pulse into a measure of the energy of the ion beam.

20. The energy measurement assembly of claim 19 wherein the timing circuitry further includes a timer electrically coupled to the first timing differentiator.

21. The energy measurement assembly of claim 19 wherein the first and second sensors are capacitive sensors, each sensor having a metallic core which functions as the cathode of a capacitor with the ion beam functioning as the anode.

22. The energy measurement assembly of claim 19 wherein the first and second sensors are inductive sensors.

23. A method of measuring an average kinetic energy of an ion included in a selected ion pulse of an ion beam of an ion beam implanter, the ion beam comprising a series of ion pulses, the method comprising the steps of:

a) providing first and second sensors disposed along the ion beam and spaced apart a predetermined distance, the second sensor being downstream of the first sensor, the first sensor generating a signal when an ion pulse of the ion beam passes the first sensor and the second sensor generating a signal when an ion pulse of the ion beam passes the second sensor;

b) providing an estimate of ion beam energy;

c) using the estimate of ion beam energy to calculate an offset time, t(offset), the offset time being proportional to the average number of ion pulses, N, in the ion beam between the first and second sensors and the average period, T, between pulses; and d) using the calculated offset time, t(offset), and signals generated by the first and second sensors to determine an elapsed time, t, for the selected ion pulse.

24. The method of measuring an average kinetic energy of an ion of claim 23 wherein step (d) includes the substeps of:

1) determining a delay time, $\Delta t$, between a time at which the selected ion pulse passes the first sensor and an earliest subsequent time at which a next ion pulse passes the second sensor; and 2) calculating the elapsed time, t, for the selected pulse using the formula:

$$t = [N \times T] + \Delta t.$$

* * * * *